US007544968B1

(12) United States Patent
Toutounchi et al.

(10) Patent No.: US 7,544,968 B1
(45) Date of Patent: Jun. 9, 2009

(54) NON-VOLATILE MEMORY CELL WITH CHARGE STORAGE ELEMENT AND METHOD OF PROGRAMMING

(75) Inventors: Shahin Toutounchi, Pleasanton, CA (US); James Karp, Saratoga, CA (US); Jongheon Jeong, Palo Alto, CA (US); Michael G. Ahrens, Sunnyvale, CA (US); Michael J. Hart, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 104 days.

(21) Appl. No.: 11/210,499

(22) Filed: Aug. 24, 2005

(51) Int. Cl.
H01L 29/04 (2006.01)
(52) U.S. Cl. .................. 257/50; 257/E23.147
(58) Field of Classification Search ............. 257/50, 257/23.147
See application file for complete search history.

(56) References Cited

U.S. PATENT DOCUMENTS

| 5,371,395 | A |   | 12/1994 | Hawkins |
| 5,404,037 | A |   | 4/1995  | Manley |
| 5,646,903 | A |   | 7/1997  | Johnson |
| 5,737,261 | A |   | 4/1998  | Taira |
| 5,796,650 | A |   | 8/1998  | Wik et al. |
| 5,808,932 | A |   | 9/1998  | Irrinki et al. |
| 5,822,267 | A |   | 10/1998 | Watanabe et al. |
| 5,946,575 | A | * | 8/1999  | Yamaoka et al. ............. 438/276 |
| 6,156,593 | A |   | 12/2000 | Peng et al. |
| 6,266,269 | B1 |  | 7/2001  | Karp et al. |
| 6,442,073 | B1 |  | 8/2002  | Sansbury |
| 6,462,375 | B1 | * | 10/2002 | Wu ............................ 257/316 |
| 6,510,085 | B1 |  | 1/2003  | Fastow et al. |
| 6,521,946 | B2 |  | 2/2003  | Mosher |
| 2002/0074606 | A1 | | 6/2002 | Mosher |
| 2003/0071316 | A1 | | 4/2003 | Gonzalez et al. |
| 2003/0098479 | A1 | | 5/2003 | Murthy et al. |
| 2003/0127681 | A1 | * | 7/2003 | Nishioka et al. ............ 257/315 |
| 2003/0173638 | A1 | | 9/2003 | Hayashi |
| 2003/0178683 | A1 | | 9/2003 | Hayashi |
| 2004/0223363 | A1 | | 11/2004 | Peng |
| 2006/0292754 | A1 | | 12/2006 | Min et al. |

OTHER PUBLICATIONS

U.S. Appl. No. 11/210,496, filed Aug. 24, 2005, Karp et al.
U.S. Appl. No. 11/210,500, filed Aug. 24, 2005, Karp et al.
U.S. Appl. No. 11/210,595, filed Aug. 24, 2005, Ahrens et al.
Iranmanesh, Ali et al., "Antifuse Reliability and Link Formation Models", 1994 Int'l Integrated Reliability Workshop Final Report, Oct. 16-19, 1994, pp. 90-94, available from IEEE, 3 Park Avenue, 17th Floor, New York, NY 10016-5997.
Karp, James et al., "Understanding Degradation and Breakdown of $SiO_2$ Gate Dielectric with "Negative Hubbard U" Dangling Bonds", Journal of Applied Physics, vol. 95, No. 5, Mar. 1, 2004, pp. 2490-2494, available from American Institute of Physics, One Physics Ellipse, College Park, Maryland 20740-3843.

* cited by examiner

Primary Examiner—Bradley K Smith
Assistant Examiner—Amar Movva
(74) Attorney, Agent, or Firm—Scott Hewett

(57) ABSTRACT

An MOS transistor is programmed in a non-volatile memory cell. A storage capacitor in the non-volatile memory cell is used to enhance programming efficiency by providing additional charge to the programming terminal of the MOS transistor during breakdown of the gate dielectric, thus avoiding soft programming faults. In a particular embodiment the storage capacitor is a second MOS transistor having a thicker gate dielectric layer than the dielectric layer of the programmable MOS transistor.

13 Claims, 9 Drawing Sheets

NON-VOLATILE MEMORY CELL WITH CHARGE STORAGE ELEMENT AND METHOD OF PROGRAMMING

FIELD OF THE INVENTION

This invention relates generally to one-time-programmable non-volatile memory cells, commonly referred to as "anti-fuses," and methods of programming non-volatile memory cells.

BACKGROUND OF THE INVENTION

Various types of memory are used with digital integrated circuits ("ICs"). Volatile memory is a type of memory that loses its stored information when power is removed from the memory circuit. Random access memory ("RRAM") is an example of volatile memory. A RAM cell can be easily reprogrammed to a desired logic state, and is often implemented in complementary metal-oxide-semiconductor (CMOS) logic. Non-volatile memory is a type of memory that preserves its stored information even if power is removed. Read-only memory ("ROM") is an example of non-volatile memory.

Programmable read-only memory ("PROM") is a type of memory that is configured to a desired state. A programming signal is applied to a PROM memory cell to change the cell from a first condition (i.e. first logic state) to a second condition (i.e. a second logic state). Programmable non-volatile memory is desirable in programmable logic devices ("PLDs"), such as field-programmable gate arrays ("FPGAs") and complex programmable logic devices ("CPLDs"). Some types of programmable non-volatile memory, such as flash memory, can be repeatedly programmed. Another type of programmable non-volatile memory is one-time programmable memory.

One-time programmable non-volatile memory makes use of elements commonly referred to as "anti-fuses." While a fuse is generally an electric component that transitions from a short-circuit state to an open-circuit state, an anti-fuse transitions from an open-circuit condition to a short-circuit condition. Various types of anti-fuses are used. An example of a three-terminal non-volatile element (i.e. a three-terminal anti-fuse) that merges source and drain regions using a gate terminal as the programming terminal is described in U.S. Pat. No. 6,266,269, issued to James Karp, Daniel Gitlin, and Shahin Toutounchi on Jul. 24, 2001, the disclosure of which is hereby incorporated by reference in its entirety for all purposes.

Non-volatile memory elements are used in many types of programmable memory applications. In some application, thousands or even hundreds of thousands of non-volatile memory elements are programmed in a single IC. If a memory cell is not programmed correctly, a fault in the programmed memory can occur. Minor variations in the fabrication of any of the several layers and patterns in a memory cell can cause a hard programming fault, where the cell state does not change after programming, or a soft programming fault, where the cell state is altered (e.g. from a non-conductive state to a conductive state), but has an undesirably high resistance, for example. A typical technique to insure proper operation of the programmed memory is to provide redundant memory cells to substitute for memory cells with hard or soft programming faults.

For example, if the user is 99% certain that no more than 10% of the memory cells will not program correctly, an additional 10% of memory cells (i.e. 110% of the total memory cells needed for operation of the IC design) can be included on the IC. The numbers used in this example are chosen merely for purposes of illustration. Logic and switching networks on the IC can be used to route around the bad memory cell and use the redundant memory cell. However, redundancy takes up area on the IC, which is undesirable.

Therefore, techniques for reducing programming faults of one-time-programmable non-volatile memory cells are desired.

SUMMARY OF THE INVENTION

An MOS transistor is programmed in a non-volatile memory cell. A storage capacitor in the non-volatile memory cell is used to enhance programming efficiency by providing additional charge to the programming terminal of the MOS transistor during breakdown of the gate dielectric, thus avoiding soft programming faults. In a particular embodiment the storage capacitor is a second MOS transistor having a thicker gate dielectric layer than the dielectric layer of the programmable MOS transistor.

DETAILED DESCRIPTION OF THE DRAWINGS

I. An Exemplary Three-Terminal Non-Volatile Memory Element

Figure 1A:
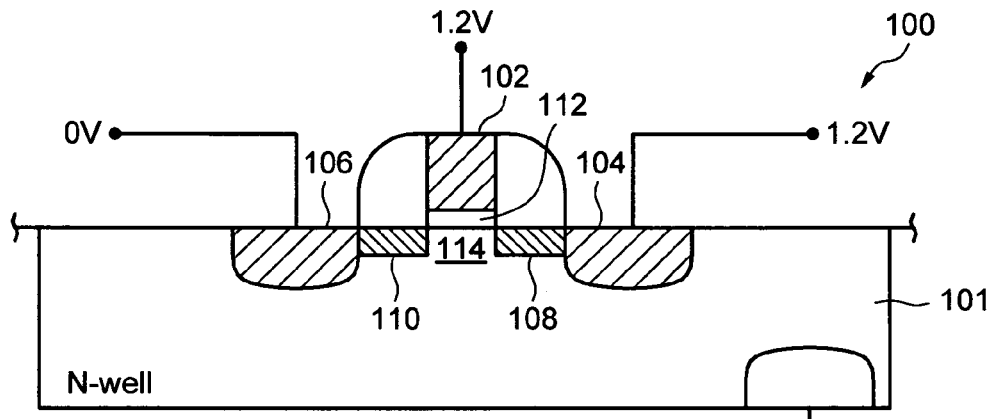
FIG. 1A is a diagram of a three-terminal non-volatile memory element according to an embodiment of the present invention before programming.

FIG. 1A is a diagram of a three-terminal non-volatile memory element ("memory element") 100 according to an embodiment of the present invention before programming. The memory element 100 is a PMOS transistor formed in an N-well 101 and having a gate terminal 102, which is the programming terminal of the memory element, source and drain contact regions 104, 106; lightly doped source and drain regions, which are p-type regions, 108, 110 formed in the N-well. A gate oxide 112 separates the gate terminal 102 from a channel region 114 formed in the N-well of the memory element. In some embodiments, the source and drain regions extend slightly beneath the gate terminal. The N-well 101, gate terminal 102, and source contact region 106 are biased to 1.2 volts. Alternatively, the bias voltage is different. In a particular embodiment, the PMOS transistor is physically symmetrical in that the source and drain are electrically interchangeable.

The memory element is read by detecting the source-drain current, which is essentially zero because the PMOS transistor is in the OFF state. Similarly, no current flows through the gate oxide 112. The memory element is in a nonconductive state, which is a first memory element state. In an alternative embodiment, the N-well, gate, and source contact region are not biased to the same voltage, but are alternatively biased so that essentially no current flows between the source and the drain.

Figure 1B:
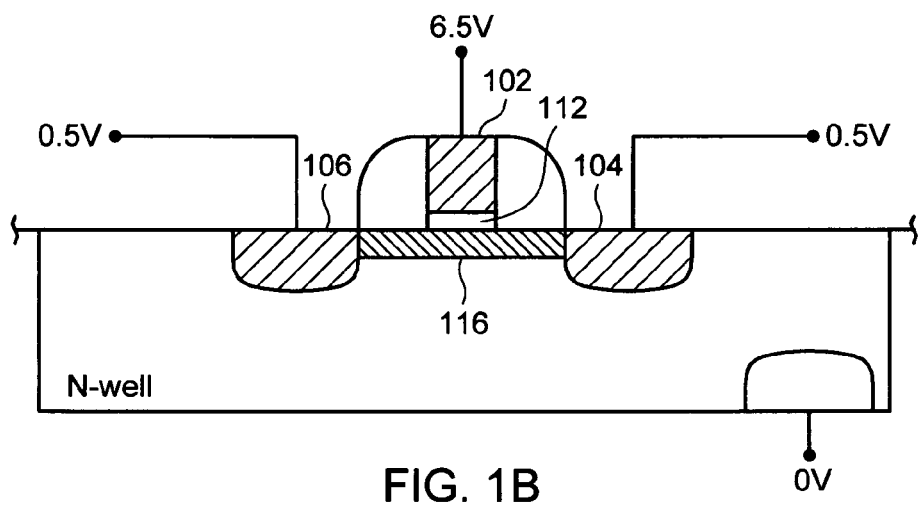
FIG. 1B is a diagram of the of the three-terminal non-volatile memory element of FIG. 1A during programming.

FIG. 1B is a diagram of the of the three-terminal non-volatile memory element of FIG. 1A during programming. A voltage sufficient to "blow" the gate oxide is applied to the gate 102, creating heat in the channel region (see FIG. 1A, ref. num. 114) that merges the lightly doped source and drain regions (see FIG. 1A, ref. nums. 108, 110) to form a p-type non-volatile low-resistance path 116 between the source 106 and drain 104 regions. In a particular embodiment, the source and drain contact regions 104, 106 are optionally biased above the N-well potential to enhance the electric field strength between the gate and the substrate (N-well) above the channel region (see FIG. 1A, ref. num. 114), which is discussed in further detail below in section III.

Figure 1C:
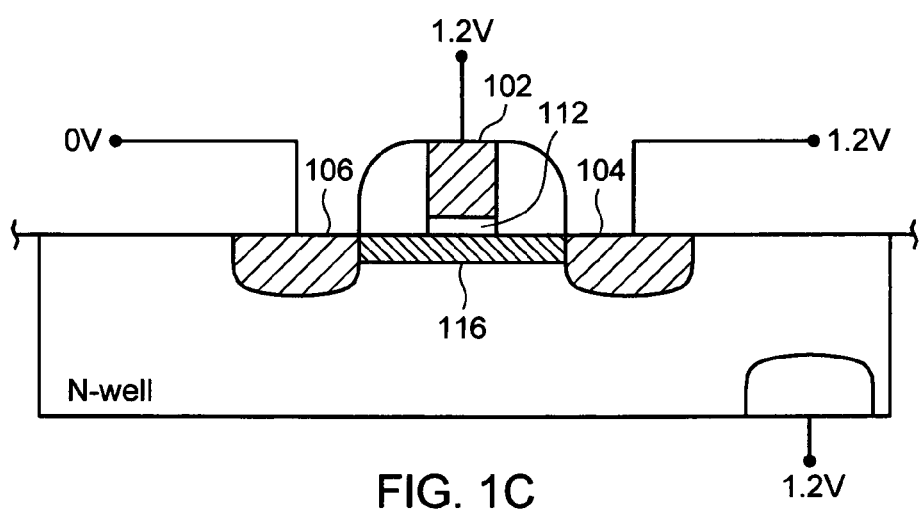
FIG. 1C is a diagram of the three-terminal non-volatile memory element of FIG. 1B after programming.

FIG. 1C is a diagram of the three-terminal non-volatile memory element of FIG. 1B after programming. The p-type non-volatile low-resistance path 116 allows current to flow between the source contact region 104 and the drain contact region 106. The memory element is in a conductive state, which is a second memory element state. The gate oxide 112 is blown during programming to generate heat and merge the source and drain regions.

II. An Exemplary Non-Volatile Memory Cell

Figure 2A:
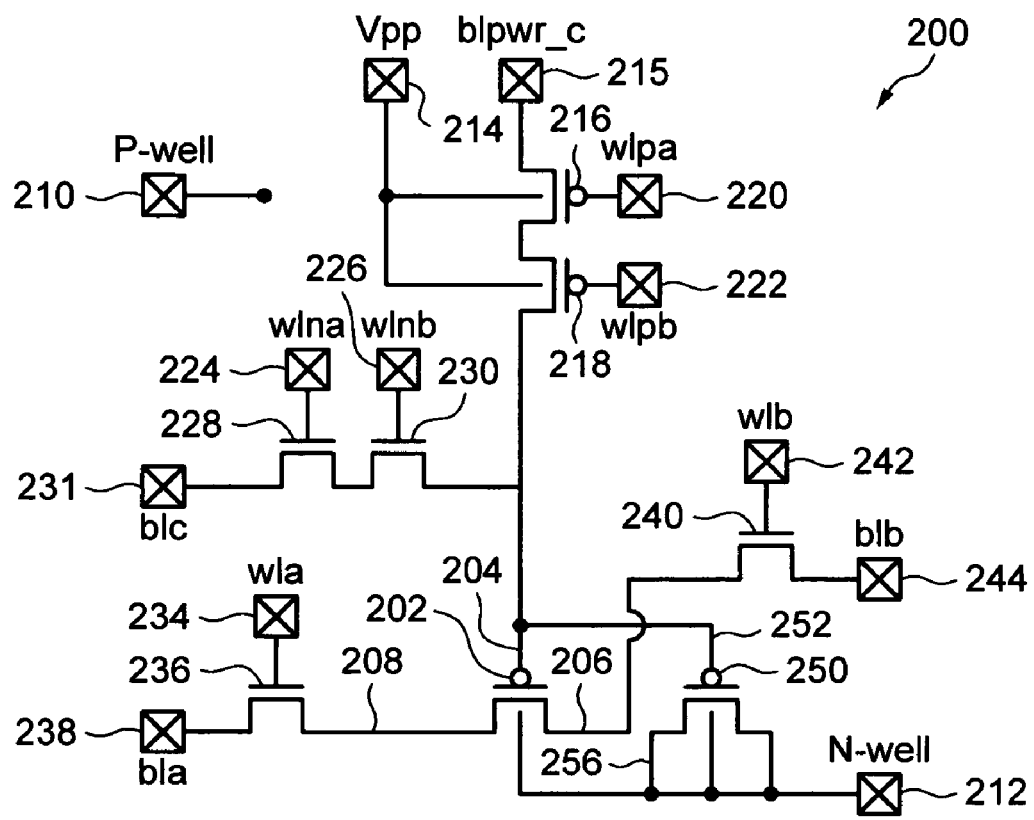
FIG. 2A is a circuit diagram of a non-volatile memory cell according to an embodiment of the invention.

FIG. 2A is a circuit diagram of a non-volatile memory cell ("memory cell) 200 according to an embodiment of the invention. A three-terminal non-volatile memory element ("storage transistor") 202, which in this example is a PMOS transistor but, with appropriate modification of the memory cell, is alternatively an NMOS transistor, has a gate terminal 204, a source terminal 206, and a drain terminal 208. The memory cell 200 is typically used in a memory array (see FIG. 2B) having bit lines and word lines, as is well known in the art. For example, a word line selects a row of memory cells in the memory array, and a bit line selects a column of memory cells in the memory array. Thus, each memory cell may be accessed using a word line in conjunction with a bit line. In a particular embodiment, each word line is accessible from either side of the array (commonly designated as wla and wlb) and each bit line is accessible from either end of the array (commonly designated as bla and blb). The ability to access a memory element from either "side" is desirable because it allows comparing the a-side reading against the b-side reading.

Wlpa and wlpb are the terminals that control the p-type devices 216, 218 in the programming (gate) path of the storage transistor 202. Wlpa and wlpb independently control these pass transistors 216, 218. The high voltage supplied to the gate 204 of the storage transistor 202 is divided by transistors 216, 218 to avoid damage to these transistors when the storage transistor 202 is programmed. Wlna and wlnb control n-type pass transistors 228, 230, which provide another path to the gate 204 of the storage transistor 202. This path is used to ground or otherwise bias the gate of the storage transistor if it will not be programmed. In a typical array, many storage cells will be simultaneously programmed, and others will not be programmed.

If the cell is programmed, p-type pass transistors 220, 222 are turned ON, n-type pass transistors 228, 230 are turned OFF, and the programming signal (e.g. 6.5 V) is applied to a programming signal terminal 214 and to blpwr_c 215. If the cell is not programmed, p-type pass transistors 220, 222 are turned OFF (if in the same column as the programmed cell) or blpwr is not applied (if in the same row as the programmed cell), n-type pass transistors 228, 230 are turned ON, and blc 231 is grounded, which keeps the gate 204 from floating. The path through n-type pass transistors 228, 230 is also used to bias the gate 204 during a READ operation, which allows shutting off $V_{pp}$ and bringing in a standard CMOS read. Alternatively, a single path to the gate 204 of the programming transistor is switched between a programming signal and ground, instead of providing a second path with additional pass transistors. Terminals 210, 212 provide connectivity to the P-wells and N-wells of devices in the memory cell.

Terminal wla 234 controls transistor 236 to connect bla terminal 238 to the drain terminal 208 of the storage transistor 202. Transistor 240 is controlled by terminal wlb 242 to connect the blb terminal 244 to the source terminal 206 of the storage transistor 202. A transistor 250 is configured so that its drain, source, and well are all connected to the N-well bias (terminal 212). This transistor acts as a capacitive storage element and is used to improve programming of the storage transistor by storing charge (energy) that is released through the programming terminal (gate 204) of the storage transistor 202 during programming to facilitate breakdown of the gate dielectric of the storage transistor. The gate dielectric on the capacitive storage element 250 has higher breakdown strength than the gate dielectric on the storage transistor 202. In a particular embodiment, the gate dielectric is thicker on the capacitive storage element to avoid breakdown during programming of the storage transistor. The capacitive storage element will be referred to as a programming enhancement capacitor ("PEC") for convenient discussion, and is discussed in further detail below in section V.

In a particular embodiment, the memory cell 200 is fabricated using conventional CMOS techniques and is incorporated in an IC having conventional CMOS circuits. In one embodiment, the CMOS fabrication sequence used to fabricate a memory cell according to an embodiment of the present invention provides gate dielectric layers having different breakdown strengths. In a particular embodiment, a CMOS fabrication sequence provides gate oxides of three different thickness, which will be referred to as thick gate oxide, mid gate oxide, and thin gate oxide. For example, a thick gate oxide is about 52 Angstroms thick, a mid gate oxide is about 22 Angstroms thick, and a thin gate oxide is about 15 Angstroms thick. Transistors 216, 218, 228, 230, 236, 240 have thick gate oxide. Storage transistor 202 has thin gate oxide to facilitate programming, and transistor 250 has mid gate oxide to facilitate charge storage during programming and to insure that the storage transistor 202 breaks down during programming before transistor 250.

III. Programming a Three-Terminal Non-Volatile Memory Element Using Source-Drain Bias Referring to FIG. 1B and to U.S. Pat. No. 6,266,269, issued Jul. 24, 2001 to Karp et al., programming a three-terminal non-volatile memory element ("storage transistor") so that a low-resistance path is established between the drain and source regions is achieved by applying a voltage to the gate terminal that blows the gate dielectric (e.g. gate oxide) to heat the channel region and merge the drain and source regions. The memory cell is read through the source-drain connection. For unprogrammed memory cells, very little current will flow between the source and the drain during a READ operation. A programmed memory cell (i.e. one in which the source and drain regions have been merged) typically conducts several orders of magnitude more current between the source and drain during a READ operation of the memory cell.

In some instances, the gate oxide (FIG. 1A, ref. num. 112) of the storage transistor prematurely breaks down during programming so as to provide a conductive path between the gate terminal (FIG. 1A, ref. num. 102) and one of the source terminal contact region 104 and the drain contact region 106. This is known as a "soft break" programming fault and interferes with merging the source and drain regions 108, 110. A soft break can result in a programming fault because the voltage on the source or drain may be different during reading of the memory state. It is more desirable to have the gate oxide break down catastrophically over the channel region to focus microheating between the drain and source regions and promote interdiffusion of dopant species, and a low-resistance, ohmic path. However, the physical topology of MOS devices often creates stresses near the edges of regions, which promote arching in these areas (i.e. soft breaks).

An embodiment of the invention applies a bias voltage(s) to the source and drain of a storage transistor so that the highest electric field differential occurs between the channel region (FIG. 1A, ref. num. 114) and the gate terminal 102 of the storage transistor. This enhances formation of a non-volatile low-resistance path 116 between the source contact region 104 and the drain contact region 106, rather than an undesirable gate-drain or gate-source conductive path. Focusing the programming energy between the source and drain regions promotes formation of the desired low-resistance path and improves programming yield (i.e. the number of programmed memory cells that successfully form the desired non-volatile low-resistance path between the source and the drain). An improvement in programming yield allows a reduction in redundancy of memory cells. A PMOS storage transistor is illustrated; however, an NMOS transistor is used in alternative embodiments In a particular embodiment, 1.2 V is coupled to terminals 234, 238, 242 and 244, such as from a programmer node or a tester node. This raises the potential of the source region and drain region to about 0.5 V, due to the NMOS threshold drop of transistors 236, 240. The N-well is grounded (0 V) through terminal 212, thus the drain/source-well junction of the PMOS storage transistor is forward biased. The potential of the source and drain regions during programming (e.g. about 0.5 V) is chosen to insure that the highest voltage differential occurs between the gate and channel (not gate-source/drain), without unduly turning on (i.e. drawing current through) the source/drain-well junction. This concern does not arise in an NMOS embodiment because the source/drain-well junction is reversed biased. Thus, the source and drain are biased to a higher voltage, typically about 1 V to 1.5 V, in an NMOS embodiment.

A programming pulse of 6.5 V lasting about 10 mS is applied to $V_{PP}$ terminal 214. The pulse duration is merely exemplary. Programming is typically completed well before the 10 mS expires.

Figure 2B:
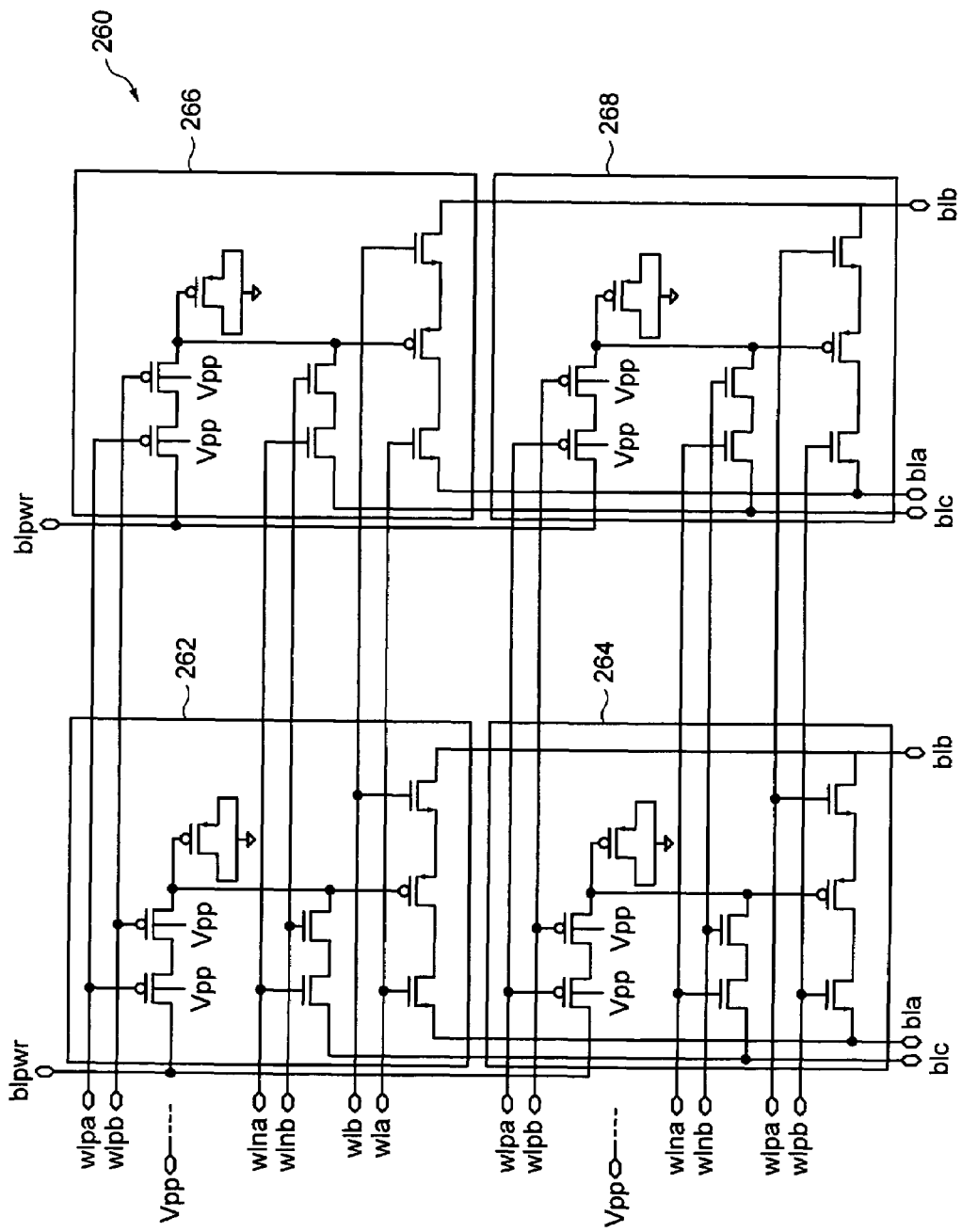
FIG. 2B is a circuit diagram of a portion of a memory array according to an embodiment of the invention.

FIG. 2B is a circuit diagram of a portion of a memory array 260 according to an embodiment of the invention. Four memory cells 262, 264, 266, 268 are shown. A typical memory array has many more cells; however, this simple 2×2 portion of the array will be used to illustrate how memory cells are selected and de-selected during programming.

Table 1 shows the voltages on the word lines, bit lines, and other terminals during an array programming step. Each of the four memory cells 262, 264, 266, 268 is similar to the memory cell 200 of FIG. 2A. The PECs are shown connected to ground, rather than to the N-well (compare FIG. 2A, ref. nums. 250, 256), and the well of the storage transistor is connected to the N-well pad (see FIG. 2A, ref. num. 212), but this is not shown in FIG. 2B for simplicity of illustration. The pad names in Table 1 and FIG. 2B are associated with the reference numerals shown in FIG. 2A for purposes of convenient comparison.

In the memory array 260, memory cell 268 is selected for programming, that is, memory cell 268 is in a selected row and a selected column. The other memory cells 262, 264, 266 are deselected and not programmed. Memory cell 262 is in a deselected row and also in a deselected column. Memory cell 264 is in a selected row, but in a deselected column, and memory cell 266 is in a selected column, but in a deselected row.

TABLE 1

| Pad Name | Reference Num. (FIG. 2A) | Cell 262 (V) | Cell 264 (V) | Cell 266 (V) | Cell 268 (V) |
|---|---|---|---|---|---|
| blpwr | 215 | 0-1 | 0-1 | 6.5 | 6.5 |
| $V_{PP}$ | 214 | 6.5 | 6.5 | 6.5 | 6.5 |
| wlpa | 220 | 6.5 | 0 | 6.5 | 0 |
| wlpb | 222 | 6.5 | 0 | 6.5 | 0 |
| wlna | 224 | 3.3 | 0 | 3.3 | 0 |
| wlnb | 226 | 3.3 | 3.3 | 3.3 | 3.3 |
| wla | 234 | 0 | 1.2 | 0 | 1.2 |
| wlb | 242 | 0 | 1.2 | 0 | 1.2 |
| bla | 238 | 0 | 0 | 1.2 | 1.2 |
| blb | 244 | 0 | 0 | 1.2 | 1.2 |
| pwel | 210 | 0 | 0 | 0 | 0 |
| nwel | 212 | 0 | 0 | 0 | 0 |
| blc | 231 | 0 | 0 | 0 | 0 |

To program cell 268, a positive voltage of 3.3 V applied to wlnb terminal (see FIG. 2A, ref. num. 226) minimizes the voltage across NMOS transistor 230 (see FIG. 2A), which other wise might develop blpwr 6.5 V across it. This stepsdown the voltage across these two pass transistors (see FIG. 2A, ref. nums. 228, 230). The programming signal blpwr is applied to the selected column (cells 266 and 268), but not to the deselected column (cells 262 and 264). The PMOS pass transistors in the programming path (see FIG. 2A, ref. nums. 216, 218) are turned off in the deselected row (cells 262 and 266), thus avoiding programming of cell 266, and are turned on in the selected row (cells 264 and 268). Cell 264 is not programmed because, even though the PMOS pass transistors are ON, no programming signal is provided to blpwr in that column. Only cell 268, which is in a selected row and a selected column, is programmed.

Referring to FIGS. 2A and 2B, Table 2 shows pad (terminal) voltages during reading of the memory cell 268:

TABLE 2

| Pad Name | Reference Num. (FIG. 2A) | Voltage (V) |
|---|---|---|
| blpwr | 215 | 1.2 |
| $V_{PP}$ | 214 | 1.2 |
| wlpa | 220 | 0 |
| wlpb | 222 | 0 |
| wlna | 224 | 0 |
| wlnb | 226 | 0 |
| wla | 234 | 2.5 |
| wlb | 242 | 2.5 |
| bla | 238 | 0 |
| blb | 244 | 1.2 |
| pwel | 210 | 0 |
| nwel | 212 | 1.2 |
| blc | 231 | 0 |

Figure 3:
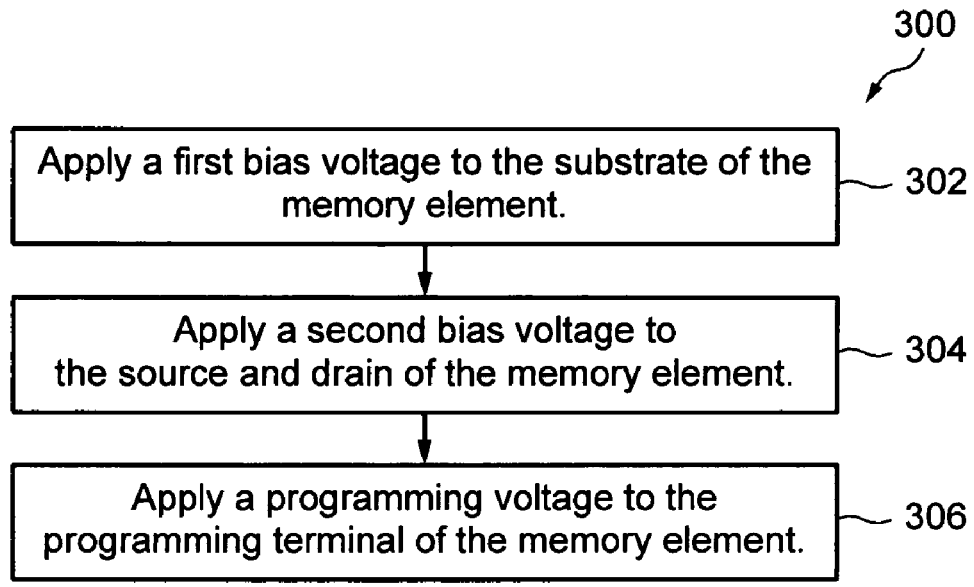
FIG. 3 is a flow chart of a method of programming a three-terminal non-volatile memory element according to an embodiment of the invention.

FIG. 3 is a flow chart of a method 300 of programming a three-terminal non-volatile memory element according to an embodiment of the invention. The three-terminal non-volatile memory element having a gate terminal (programming terminal), a source terminal and a drain terminal is fabricated in a substrate, such as a silicon substrate. A first bias voltage is applied to the substrate (step 302). A second bias voltage is applied to the source terminal and to the drain terminal (step 304). Typically, both the drain and the source are biased to the same potential, but both terminals are accessible, so each could be biased to a different level. In a particular embodiment, the second bias voltage is applied to each of the source terminal and the drain terminal. Steps 302 and 304 occur concurrently in an alternative embodiment, and step 304 occurs before step 302 in another alternative embodiment. A programming voltage is applied to the gate (programming) terminal (step 306) so as to form a non-volatile low-resistance path between the source terminal and the drain terminal. The second bias voltage is selected so that the greatest electric field differential occurs between the gate terminal and the substrate. In other words, the second bias voltage is between the first bias voltage (applied to the substrate) and the programming voltage (applied to the gate terminal).

NMOS and PMOS three-terminal non-volatile memory elements are used in embodiments. Either device can be programmed with either a negative or positive programming signal (with respect to the substrate potential) applied to the gate terminal. In a particular embodiment, a positive programming voltage is applied to the gate terminal of an NMOS three-terminal non-volatile memory element, which the same polarity of an NMOS FET used in a CMOS application. In an alternate embodiment, a positive programming voltage is applied to the gate terminal of a PMOS three-terminal non-volatile memory element, which is the opposite polarity of a PMOS FET used in a CMOS application.

IV. Programming a PMOS Three-Terminal Non-Volatile Memory Element

Referring to FIG. 2A, the storage transistor 202 is a PMOS device. In a particular embodiment, the N-well (see FIG. 1A, ref. num. 101) is formed in a silicon wafer substrate and boron is chosen as the p-type dopant for forming the source and drain regions 108, 110. Boron is particularly desirable for use as a dopant when using localized micro-heating techniques to merge source and drain regions because boron has a relatively high diffusion coefficient ("diffusivity"). This promotes better merging for the same programming energy, compared to typical n-type dopants.

For example, arsenic, which is an n-type dopant often used in CMOS fabrication, has a diffusion coefficient of 0.38 cm$^2$/second. In comparison, boron has a diffusion coefficient of 5.1 cm$^2$/second. This is more than ten times greater than the diffusion coefficient of arsenic. Thus, for a given amount of heating applied to the channel region of the storage transistor, greater interdiffusion of boron (i.e. diffusion of the dopant from the source region toward the drain region and concurrent diffusion from the drain region toward the source region) will occur compared to a similar device using arsenic.

When programming a PMOS storage transistor, it is particularly desirable to bias the gate terminal with a positive voltage with respect to the substrate (i.e. the channel region of the N-well). In a particular embodiment, the N-well is at ground potential and a positive programming voltage is applied to the gate terminal (see Table 1). This type of bias polarity is commonly referred to as "accumulation mode," and is opposite from the type of biasing polarity that is used during CMOS operation of a PMOS transistor. In other words, a PMOS transistor in a typical CMOS circuit application has a negative voltage applied to its gate terminal. In a particular embodiment, the P-N well junction of the PMOS transistor is forward biased to about 0.5 V, which slightly forward biases the device without drawing excessive current.

It is desirable that the gate terminal of a PMOS storage transistor be more positive than the substrate because during breakdown of an isolator (e.g. the gate dielectric), energy is released at the negative electrode. By using a positive programming voltage to program a PMOS storage transistor, the desired microheating occurs in the substrate (negative electrode), rather than in the gate (positive) electrode. Creating heat in the substrate, rather than in the gate electrode, promotes merging the source and drain regions to result in a non-volatile low-resistance path between the source and drain. In a particular embodiment, the source and drain are slightly biased to insure that the greatest potential difference arises across the channel region, as described above in section III.

During programming of an NMOS storage transistor, the P-well is grounded and a positive programming voltage is applied to the gate terminal. Providing a positive programming voltage when programming an NMOS transistor desirably heats the substrate, rather than the gate, of the NMOS device. Thus, an N-well device is programmed with the same polarity used during operation of an NMOS transistor in a typical CMOS circuit application.

Although a PMOS storage transistor may be alternatively biased using a negative programming voltage, heating of the substrate between the source and drain regions is reduced for two reasons. First, most of the heat will be generated in the gate, as discussed above. Second, the gate dielectric typically has a low thermal conductivity, essentially providing thermal insulation between the heat generated in the gate and the portion of the substrate between the source and drain regions. However, during gate dielectric breakdown some heating of the substrate occurs, which may be sufficient to merge source and drain regions in some PMOS storage transistors programmed with a negative programming voltage.

V. Non-Volatile Memory Cell with Charge Storage Element

Referring to FIG. 2A, the memory cell 200 includes a transistor 250 with its gate 252 connected to the gate terminal 204 of the PMOS three-terminal non-volatile memory element 202 and its source 254 and drain 256 connected to the N-well bias 212. In this configuration, the transistor 250 acts as a PEC, which is generally a capacitor in parallel with the gate terminal 204 and substrate of the PMOS three-terminal non-volatile memory element 202. In an alternative embodiment, the three-terminal non-volatile memory element is an NMOS transistor and appropriate changes are made to the bias and programming voltages and other elements of the memory cell.

Those of skill in the art appreciate that any of several voltage waveforms may be used to program non-volatile memory elements. A 10 ms programming pulse is used for purposes of convenient discussion. The pulse duration is generally chosen to be sufficiently long to complete programming of the memory cell(s), yet not so long that substantial time is wasted after a memory cell has been programmed or has failed to program.

In practice, the leading edge of a programming pulse is slowed by parasitic effects in the memory array and memory cell, such as parasitic inductance, capacitance, and resistance. Thus, the top of the programming pulse is rounded, with some amount of time lapsing between when the leading edge of the programming pulse arrives at the gate terminal 204 of the storage transistor 202 and when the programming pulse reaches its maximum voltage.

The maximum voltage of the programming pulse exceeds the breakdown voltage of the gate dielectric (see FIG. 1A, ref. num. 112) of the storage transistor 202. Charge is accumulated in both the storage transistor 202 and the PEC 250 until the gate dielectric of the storage transistor breaks down, allowing current to flow between the gate terminal 204 and the substrate of the storage transistor 202. The current that is discharged as the gate dielectric breaks down heats the substrate between the source and drain regions of the storage transistor 202, causing interdiffusion of dopants, and merges the source and drain regions.

The PEC 250 stores energy in the form of charge. Referring to FIG. 2A, the storage transistor 202 has a thin (e.g. about 15 Angstroms) gate oxide, while the PEC 250 has a mid gate oxide (e.g. about 22 Angstroms). Alternatively, the capacitor 250 has a thick gate oxide (e.g. about 52 Angstroms); however, a thicker gate oxide reduces the charge stored by the PEC 250 prior to gate dielectric breakdown of the storage transistor 202, reducing the supplemental energy provided to the gate terminal of the storage transistor during breakdown.

The energy stored by the storage transistor at the moment of breakdown is $C_{ST} \times V_B^2$ where $C_{ST}$ is the capacitance of the storage transistor 202 and $V_B$ is the break down voltage of the gate dielectric layer of the storage transistor 202. If the PEC 250 has a second capacitance Cc, then the energy stored by the combination of the storage transistor 202 and the PEC 250 is $(C_{ST}+C_C) \times V_B^2$. The PEC 250 is connected directly to the gate terminal 204 of the storage transistor 202, providing a low-impedance path for the stored energy. In a particular embodiment, the impedance between the PEC 250 and the gate terminal 204 is believed to be about one ohm, while the impedance between terminal 215 and the gate terminal 204 is on the order of kilo-ohms. A low-impedance path provides efficient energy transfer from the PEC to the gate terminal 204 during breakdown of the gate dielectric layer.

At breakdown, the energy stored in the storage transistor and in the PEC is released in the form of heat, generally between the source and drain regions of the storage transistor. For a brief time, the temperature will rise and interdiffusion of dopants will produce a non-volatile low-resistance path between the source and the drain of the storage transistor. After the gate dielectric of the storage transistor has broken down (been "blown"), a relatively low-resistance path is typically established between the gate terminal and one or both of the source terminal and drain terminal. Thus, current flowing through the gate after dielectric breakdown does not produce significant heating and it is desirable to store energy prior to breakdown and deliver it efficiently to the gate dielectric of the storage transistor during breakdown.

Using a thicker gate oxide for the PEC 250 than in the storage transistor ensures that the gate dielectric of the storage transistor 202 will break down before (i.e. at a lower voltage) than the dielectric of the PEC 250. Alternatively, different materials are used for the dielectric of the gate of a storage transistor and a PEC. The different materials have different dielectric strengths, for example. However, using different thicknesses of silicon oxide for the gate dielectric of the storage capacitor and the dielectric spacer of the capacitor is particularly desirable because different thicknesses of silicon oxide are available in conventional CMOS fabrication sequences, allowing a memory cell according to this embodiment to be incorporated in a standard CMOS component. The silicon oxide layers are typically thermally grown, which produces a very high-quality dielectric layer that produces predictable programming. Generally, the dielectric layer of the storage element should reliably break down before the dielectric layer of the PEC or other energy storage element. In an alternative embodiment, the dielectric layers of the storage element and the PEC have about the same breakdown strength, and the wells of these devices are biased differently to insure that the storage element blows first. Differentially biasing the wells is used in alternative embodiments in which the dielectric layers have different strengths.

The source and drain terminals of transistor (storage capacitor) 250 are connected to the N-well potential 212 (ground) to avoid floating these terminals. Alternatively, the source and drain terminals of transistor 250 are biased to an intermediate voltage during programming, as are the source and drain terminals of the storage transistor. In another embodiment, the supplemental charge storage device is an NMOS transistor. In yet another embodiment, charge is stored in a capacitive element that is not FET-based. For example, a transmission line is configured to store energy to enhance programming of a storage transistor.

Figure 4:
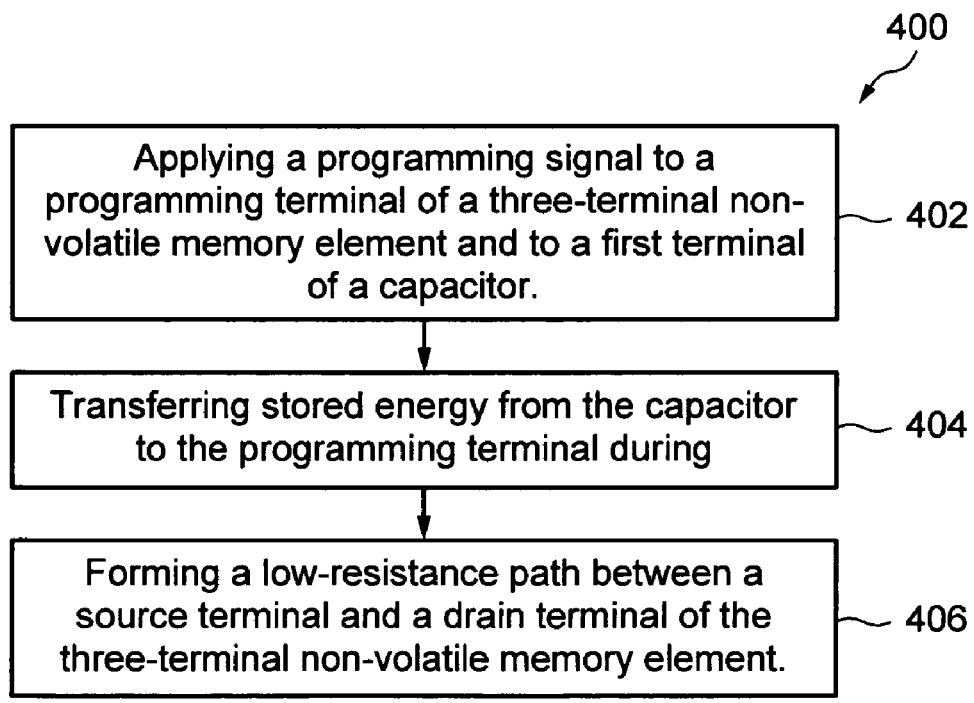
FIG. 4 is a flow chart of a method of programming a non-volatile memory cell according to an embodiment of the invention.

FIG. 4 is a flow chart of a method 400 of programming a non-volatile memory cell according to an embodiment of the invention. The memory cell has a three-terminal non-volatile memory element with a programming terminal, a substrate at a first electrical potential (e.g. ground potential), and first dielectric layer having a first dielectric breakdown strength disposed between the programming terminal and the substrate; and a PEC with a first terminal connected to the programming terminal of the three-terminal non-volatile memory element and a second terminal coupled to the substrate. The PEC has a second dielectric layer having a second dielectric breakdown strength, the second dielectric breakdown strength being greater than the first dielectric breakdown strength. Dielectric breakdown strength generally relates to the voltage at which a dielectric layer breaks down, a higher dielectric breakdown strength indicating a higher breakdown voltage. A programming signal is applied to the programming terminal of the three-terminal non-volatile memory element and to the first terminal of the capacitor so as to cause breakdown of the first dielectric layer (step 402). During breakdown of the first dielectric layer, energy stored in the PEC is transferred to the programming terminal of the three-terminal non-volatile memory element (step 404) so as to form a low-resistance path between a source terminal and a drain terminal of the three-terminal non-volatile memory element (step 406).

In a particular embodiment the three-terminal non-volatile memory element is a PMOS transistor and programming produces a low-resistance path between a source terminal and a drain terminal of the PMOS transistor. In an alternative embodiment the three-terminal non-volatile memory element is an NMOS transistor and programming produces a low-resistance path between a source terminal and a drain terminal of the NMOS transistor. In a particular embodiment, the capacitor is an FET wherein the first terminal is the gate terminal of the FET and second terminal is the substrate of the FET. In a further embodiment, the source and drain of the FET capacitor are electrically coupled to the substrate, or to ground.

VI. Three-Terminal Non-Volatile Memory Element with Hybrid Gate Dielectric

Electric breakdown often occurs first in an area of non-uniformity that produces mechanical strain or stress, or defects in a layer, or a different layer thickness. For example, a non-uniformity often occurs at the edge of the active area of an MOS storage transistor where the active area butts against trench isolation. During programming of the MOS storage transistor, breakdown, and hence heating, can occur near the edge of the active area. This is undesirable because there are not as many dopant species available for interdiffusion (merging), since the trench isolation does not provide dopant species. It is more desirable that breakdown occur away from the edge of the active area, so that the breakdown area has dopant species available on both sides. In other words, it is desirable that the heat generated when the gate dielectric is blown heats doped silicon in the channel, rather than some doped silicon in the channel and some trench isolation dielectric.

Figure 5A:
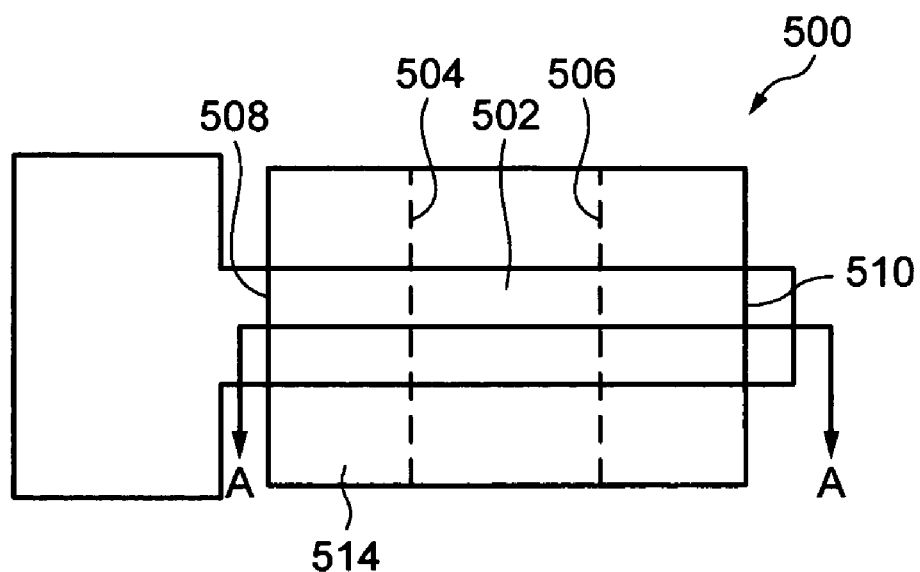
FIG. 5A is a plan view of a three-terminal non-volatile memory element according to an embodiment of the invention.

FIG. 5A is a plan view of a three-terminal non-volatile memory element ("storage transistor") 500 according to an embodiment of the invention. In one embodiment, the storage transistor is a PMOS transistor. In an alternative embodiment, the storage transistor is an NMOS transistor. The storage transistor has a gate electrode 502 overlying a hybrid gate dielectric layer (see FIG. 5B, ref. num. 524). The gate dielectric has a selectively reduced dielectric breakdown strength between the dashed lined 504, 506 to ensure that breakdown does not occur near the ends 508, 510 of the channel portion (refer to FIG. 1A, ref. num. 114) of the storage transistor. Those of skill in the art of FETs appreciate that the "length" of the gate is the short dimension of the gate, essentially between the source and drain regions, and the "width" of the gate is the long dimension, running along the source and drain. Thus, the ends 508, 510 refer to the ends of the width of the gate, and generally define what is commonly known as the active area of the FET in this dimension. Breakdown near an edge of the active area of the FET reduces the reservoir of diffusion (dopant) species by half because there are essentially no dopant species outside of the active area. This can lead to a poorly programmed storage transistor (i.e. a soft error).

Figure 5B:
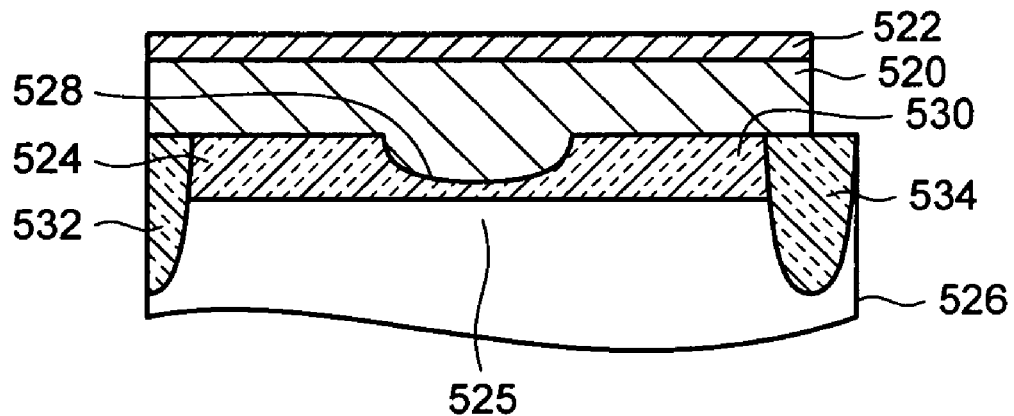
FIG. 5B is a cross section taken along section line A-A of the three-terminal non-volatile memory element of FIG. 5A.

FIG. 5B is a cross section taken along section line A-A of the three-terminal non-volatile memory element of FIG. 5A. A polysilicon layer 520 in combination with an optional silicide layer 522 form the gate electrode. A hybrid gate dielectric layer 524 is disposed between the polysilicon layer 520 and an active area 525 of a substrate 526. The hybrid gate dielectric layer 524 has a lower breakdown (thinner) portion 528 and a higher breakdown (thicker) portion 530. When sufficient voltage is provided between the gate electrode and the substrate 526, the lower breakdown portion 528 of the hybrid gate dielectric layer 524 is likely to break down before the higher breakdown portion 530. This ensures that breakdown occurs away from the ends of the channel region (see FIG. 5A, ref. nums. 508, 510), more particularly, breakdown usually occurs between the dotted lines 504, 506 shown in FIG. 5A. Isolation dielectric portions (e.g. $SiO_2$) 532, 534 electrically isolate the storage transistor from other devices on the substrate.

In a particular embodiment, the hybrid gate dielectric layer is silicon oxide, the lower breakdown portion being thinner than the higher breakdown portion. Standard CMOS fabrication processes typically provide different oxide thickness in the design specification, as discussed above in reference to FIG. 2A. In a particular embodiment wherein a CMOS fabrication process provides three different selected thicknesses of gate oxide, the lower breakdown portion of the hybrid gate dielectric layer is thin oxide and the higher breakdown portion is mid oxide. Thick oxide is optionally used for the higher breakdown portion; however, this would reduce the energy stored by the storage transistor prior to breakdown, and generate less heat for merging the source and drain of the storage transistor.

Often, gate oxide near the channel edges is slightly thinner than the gate oxide in the center of the channel. This difference in thickness does not adversely effect the operation of a MOS FET during typical use. However, when a MOS FET is used as a storage transistor, it is highly desirable that gate breakdown during programming occurs where large numbers of diffusion (dopant) species are available to merge the source and drain. The thinner oxide near the channel edges in a conventional storage transistor reduces the breakdown strength of the gate oxide layer in these areas, which only have about half the number of dopant species available. Thus, it is particularly desirable to increase the thickness of the gate oxide near the channel edges while providing thin gate oxide in the area where breakdown is desired.

Figure 6A:
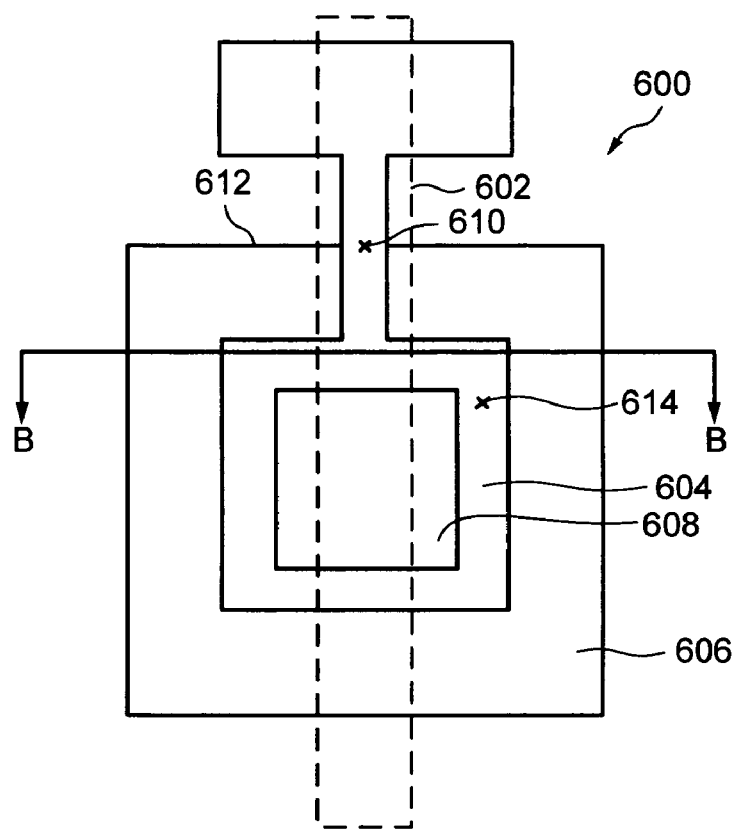
FIG. 6A is a plan view of a three-terminal non-volatile memory element according to another embodiment of the invention.

FIG. 6A is a plan view of a three-terminal non-volatile memory element ("storage transistor") 600 according to another embodiment of the invention. This type of transistor is commonly referred to as a "closed layout" transistor, and is a PMOS storage transistor or alternatively an NMOS storage transistor. A higher breakdown portion 602, which is represented by the rectangle defined by dotted line, of a hybrid gate dielectric layer is formed underneath a portion of the gate 604.

The gate 604 is between a source area 606 and a drain area 608. Electrical connections to the gate, source, and drain are typically made using vias that connect metal traces on overlying layers of an IC (not shown) to contact areas (not shown) of the storage transistor.

As discussed above in reference to FIGS. 5A and 5B, it is desirable that gate dielectric layer breakdown between source and drain regions where dopant species from both sides of the breakdown location are available for interdiffusion. It is undesirable for gate dielectric breakdown to occur at a location "X" 610 near an edge 612 of the gate length because dopant species are then available from only one side of the breakdown location. The gate dielectric layer in a conventional MOS FET is often thinner where it crosses from the field oxide to the active area of a FET. Providing a hybrid gate dielectric layer with a higher breakdown portion (e.g. a thicker portion) at the edge of the active area of the FET promotes gate dielectric breakdown occurring at a more favorable location, such as location 614, where the gate dielectric is thinner and dopant species are available from both sides of the breakdown location.

Figure 6B:
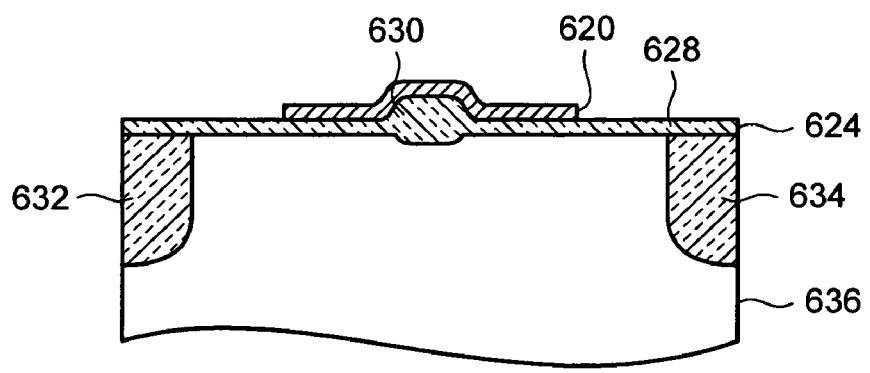
FIG. 6B is a cross section taken along section line B-B of the three-terminal non-volatile memory element of FIG. 6A.

FIG. 6B is a cross section taken along section line B-B of the three-terminal non-volatile memory element of FIG. 6A. A polysilicon layer 620 forms the gate electrode. A silicide layer is included in an alternative embodiment. A hybrid gate dielectric layer 624 is disposed between the polysilicon layer 620 and a substrate 626. The hybrid gate dielectric layer 624 has a lower breakdown (thinner) portion 628 and a higher breakdown (thicker) portion 630. When sufficient voltage is provided between the gate electrode and the substrate 626, the lower breakdown portion 628 of the hybrid gate dielectric layer 624 is likely to break down before the higher breakdown portion 630. This ensures that breakdown occurs away from the edge of the active region (see FIG. 6A, ref. nums. 610, 612), more particularly, breakdown usually occurs outside the dotted line 602 shown in FIG. 6A. Isolation dielectric portions (e.g. $SiO_2$) 632, 634 electrically isolate the storage transistor from other devices on the substrate

VII. Experimental Results

Figure 7A:
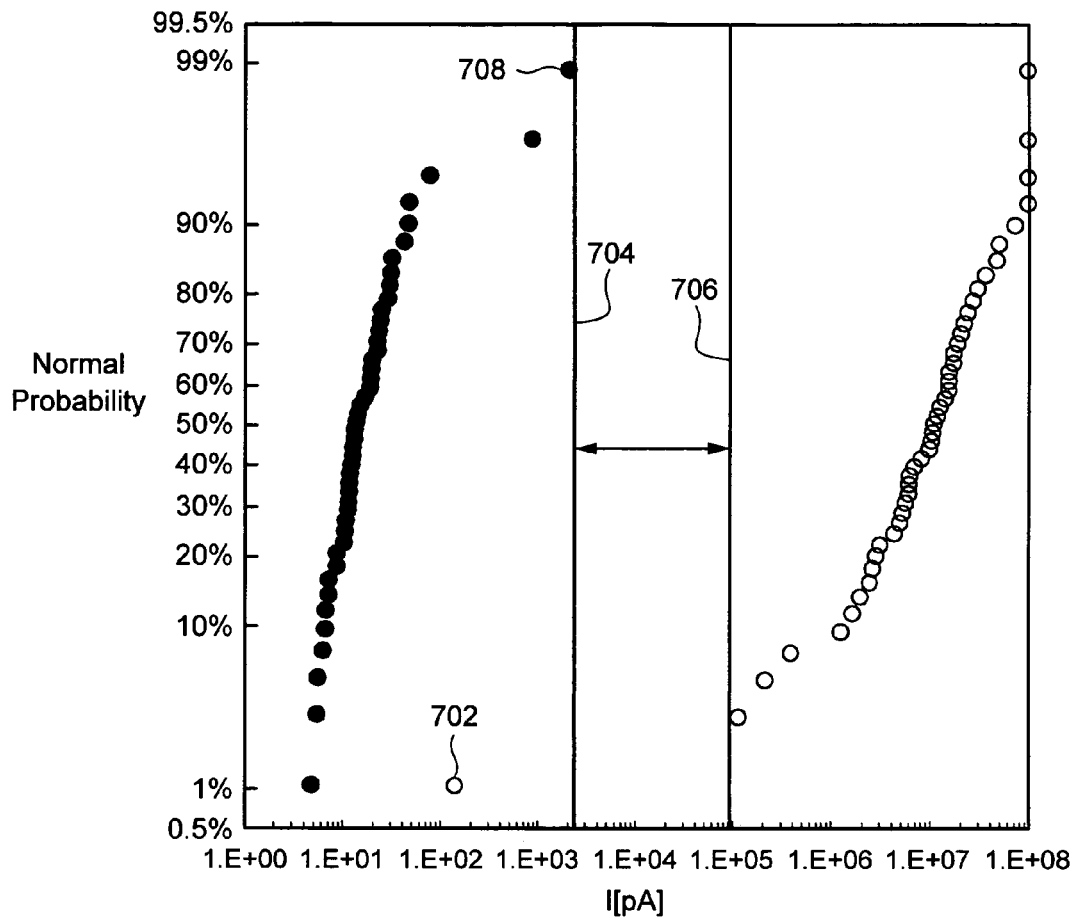
FIG. 7A is a plot of normal probability versus source-drain current (in pico-Amps) for memory cells essentially according to FIG. 2A before and after programming using a programming enhancement capacitor with mid oxide thickness.

FIG. 7A is a plot of normal probability versus source-drain current (in pico-Amps for memory cells essentially according to FIG. 2A before and after programming using a programming enhancement capacitor with mid oxide thickness. The capacitor 250 had an oxide thickness of about 22 Angstroms. The storage transistors had the thin oxide thickness (about 15 Angstroms). The storage transistors did not have a hybrid gate oxide with different thicknesses (see FIGS. 5A, 5B, ref. num. 524, 528, 530). The storage transistors were boron-doped PMOS devices, and the source and drain were biased substantially as described in section III, above.

Reading of the memory cells both before and after programming was done essentially in accordance with Table 2. The solid dots represent memory cells before programming and show a 99% normal probability that source-drain current of a three-terminal non-volatile memory cell before programming will not exceed about $2 \times 10^3$ pA. The circles represent the source-drain current through memory cells after programming. Programming was performed essentially in accordance with Table 1. Except for one data point 702, which had a source-drain current of about 20 pA before programming and only about 150 pA after programming, the remaining after-programming data points show source drain current of at least $1 \times 10^5$ pA, which is about two orders of magnitude difference. The difference in current between the most conductive non-programmed sample and the least conductive programmed sample is represented by vertical lines 704, 706.

Providing two orders of magnitude difference in current before and after programming is desirable because it is relatively easy to sense the state of the memory cell (i.e. to differentiate between a programmed memory cell and a non-programmed memory cell). Some applications may allow less separation of source-drain current between programmed and non-programmed states. It is generally desirable that the most conductive non-programmed memory cell in a non-volatile memory array has a current less than the least conductive programmed memory cell in the array. The results of FIG. 7A suggest a 2% redundancy of programmable three-terminal non-volatile memory cells in a memory array.

Figure 7B:
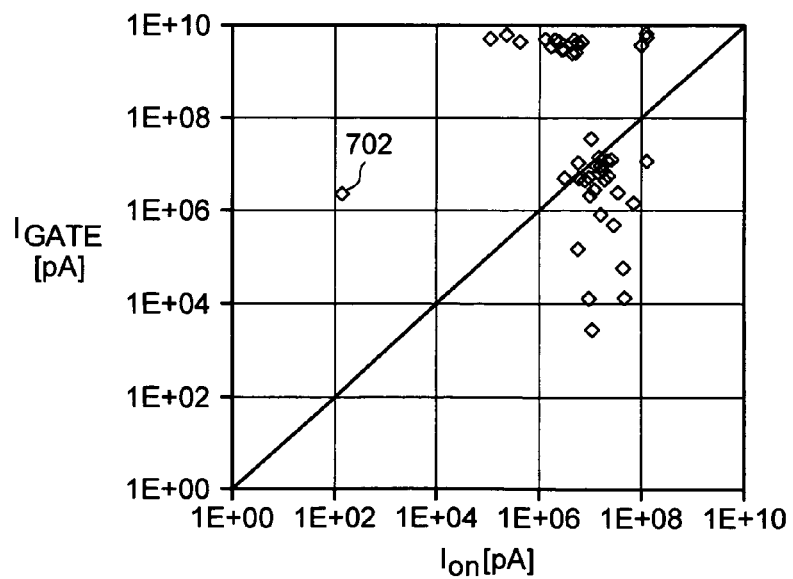
FIG. 7B shows a plot of gate current ($I_{GATE}$, pA) versus the current ($I_{ON}$, pA) when the memory cells represented in FIG. 7A were read.

FIG. 7B shows a plot of gate current ($I_{GATE}$, pA) versus the current ($I_{ON}$, pA) when the memory cells represented in FIG. 7A were read. Generally, a high $I_{ON}$ indicates that a good low-resistance path was formed between the source and the drain regions of the storage transistor and is desirable. The three-terminal non-volatile memory elements were designed so that a non-volatile low-resistance path between the source and drain is formed during programming while the programming path is through the gate terminal. As discussed above in relation to FIGS. 1A-1C, a low-resistance path(s) can also form between the gate terminal and the source and/or drain.

Most of the memory cells have an $I_{ON}$ greater than $1 \times 10^6$ pA after programming. In some instances, $I_{GATE}$ is greater than ION, indicating a gate-source conduction path, but $I_{ON}$ is sufficient to provide a successfully programmed memory cell. The data points generally indicate a desirable grouping parallel to the y-axis, indicating consistent $I_{ON}$ for the sample population of memory cells. An outlying data point 710 indicates a memory cell in which the gate dielectric was broken, but did not develop a low-resistance path between the source and the drain.

Figure 8A:
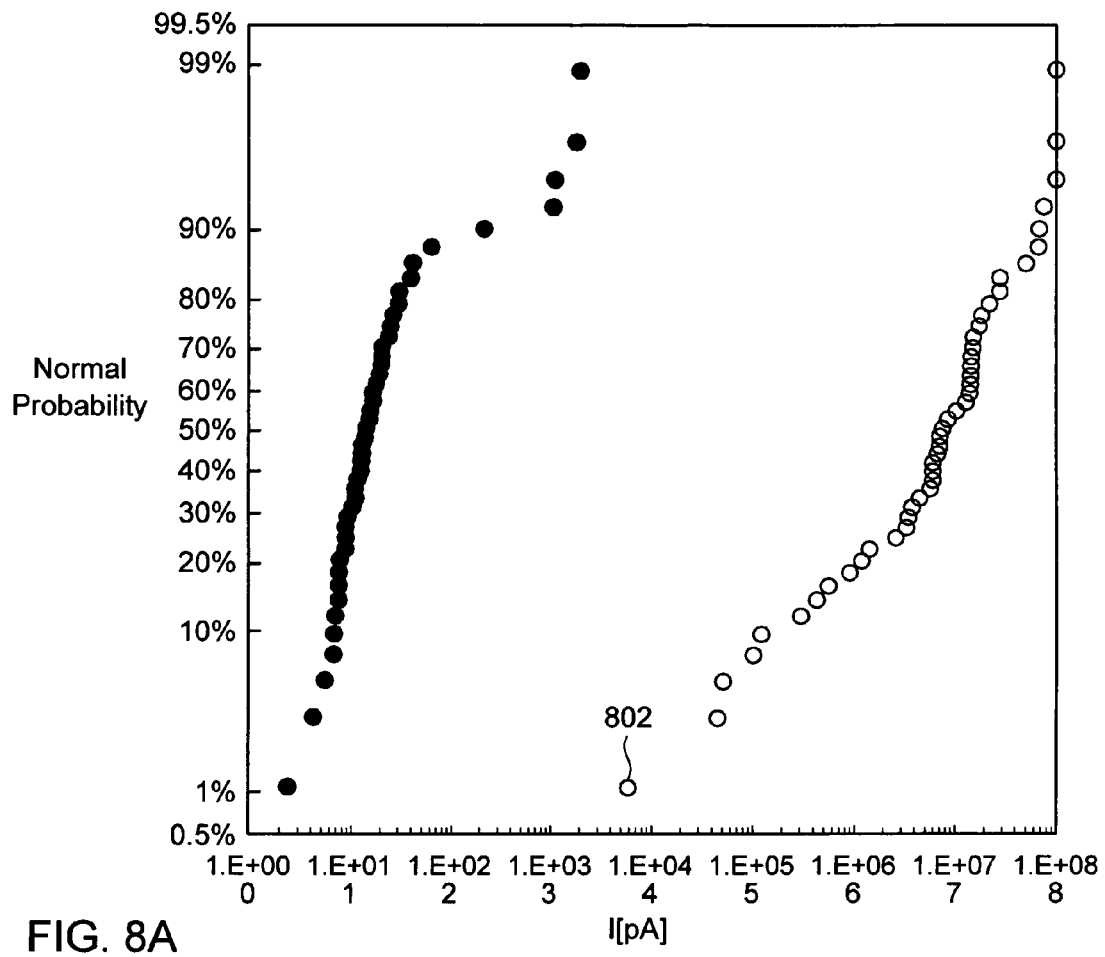
FIG. 8A is a plot of normal probability versus source-drain current (in pico-Amps for memory cells essentially according to FIG. 2A before and after programming using a programming enhancement capacitor with thick oxide.

FIG. 8A is a plot of normal probability versus source-drain current (in pico-Amps for memory cells essentially according to FIG. 2A before and after programming using a programming enhancement capacitor with thick oxide. The capacitor 250 had an oxide thickness of about 52 Angstroms. Reading of the memory cells both before and after programming was done essentially in accordance with Table 2. The solid dots represent memory cells before programming and show a 99% normal probability that source-drain current of a three-terminal non-volatile memory cell before programming will not exceed about $2 \times 10^3$ pA, which is consistent with the results shown in FIG. 7A. The circles represent the source-drain current through memory cells after programming. Programming was performed essentially in accordance with Table 1. The lowest data point 802 shows source-drain current of $5 \times 10^3$ pA. This data point 802 is essentially along the trend of the other data points; however, even if it is treated as an anomalous outlier, the next data point shows a source-drain current of about $4 \times 10^4$ pA. The separation between the programmed and unprogrammed states is not as great as when a PEC (e.g. capacitor 250) having a thinner dielectric layer, and hence greater energy storage, is used.

Figure 8B:
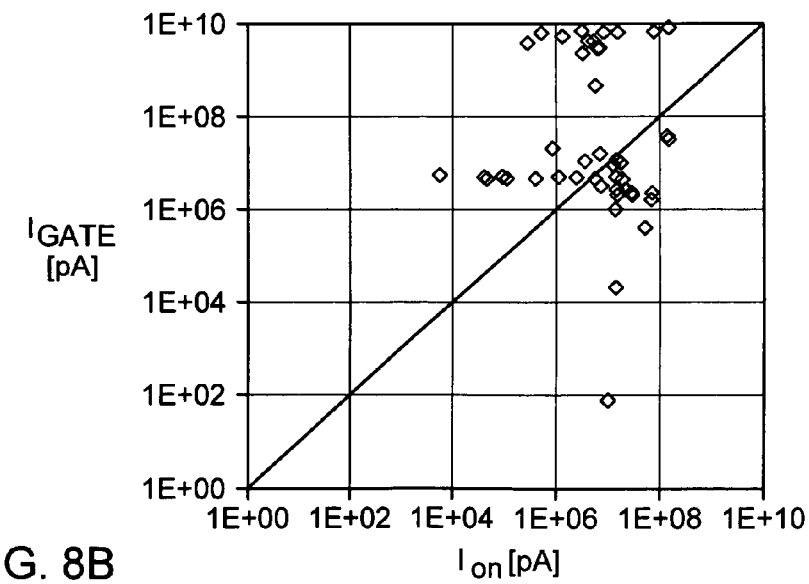
FIG. 8B shows a plot of gate current ($I_{GATE}$, pA) versus the current ($I_{ON}$, pA) when the memory cells represented in FIG. 8A were read.

FIG. 8B shows a plot of gate current ($I_{GATE}$, pA) versus the current ($I_{ON}$, pA) hen the memory cells represented in FIG. 8A were read. Generally, a high $I_{ON}$ indicates that a good low-resistance path was formed between the source and the drain regions of the storage transistor and is desirable. The three-terminal non-volatile memory elements were designed so that a non-volatile low-resistance path between the source and drain is formed during programming while the programming path is through the gate terminal. As discussed above in relation to FIGS. 1A-1C, a low-resistance path(s) can also form between the gate terminal and the source and/or drain.

Most of the memory cells have an $I_{ON}$ greater than $1 \times 10^6$ pA after programming; however, a greater proportion have an $I_{ON}$ less than $1 \times 10^6$ pA compared to FIG. 7B. Furthermore, there is more lateral (i.e. along the x-axis) distribution in $I_{ON}$. This shows that, while good results can be obtained using a PEC (e.g. capacitor 250) having a thick dielectric layer, superior results are obtained by using a PEC with a thinner dielectric layer, which allows greater energy storage before breakdown of the gate oxide of the storage transistor, as long as the dielectric layer of the PEC does not breakdown before the gate oxide.

VIII. An Exemplary IC

PLDs are a well-known type of integrated circuit that can be programmed to perform specified logic functions. For example, an FPGA typically includes an array of programmable tiles. These programmable tiles can include input/output blocks (IOBs), configurable logic blocks (CLBs), dedicated random access memory blocks (BRAM), multipliers, digital signal processing blocks (DSPs), processors, clock managers, delay lock loops (DLLs), and so forth. One-time-programmable non-volatile memory is desirable in FPGAs where it is desirable to record manufacturing information, such as lot traceability, to control or modify internal circuit functionality, to control the feature set available to the user (customer), such to block out regions of the device or to restrict operating speed, or for the user to record product and/or function of the device, for example.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

Figure 9:
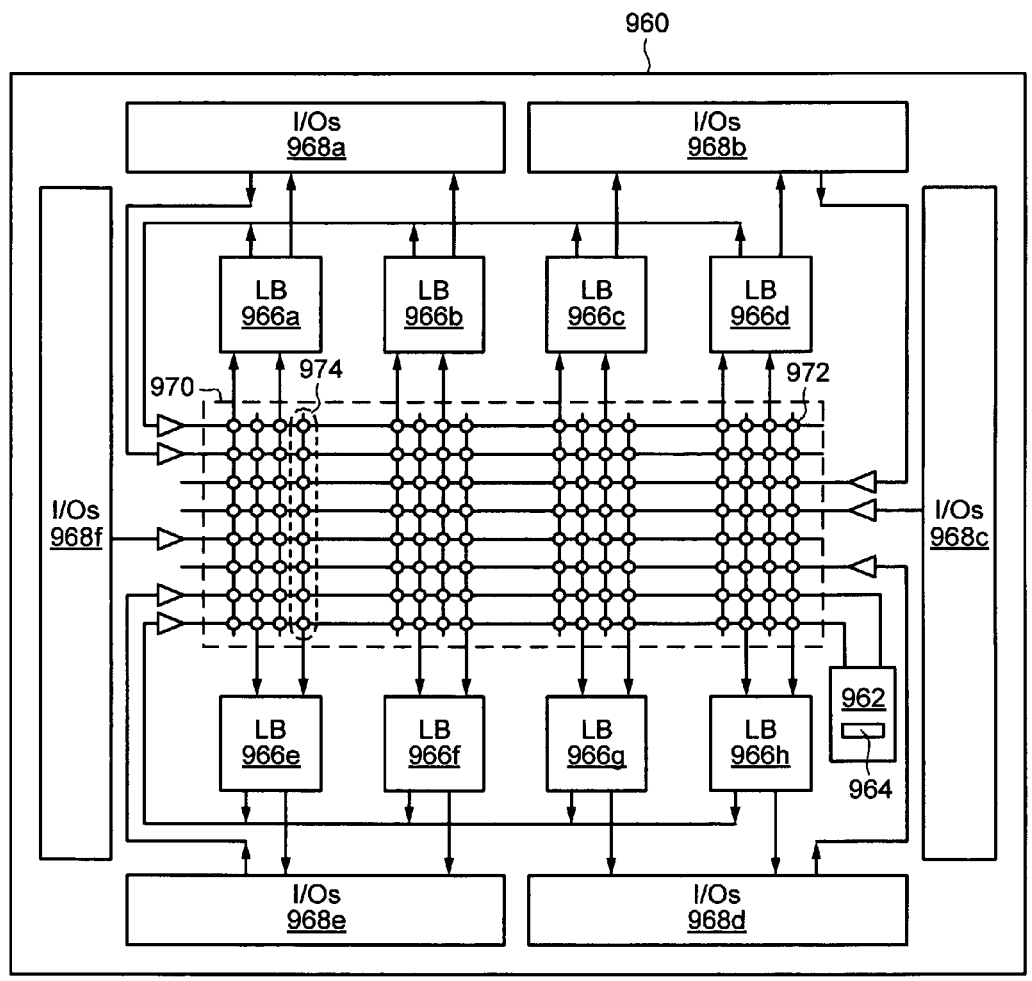
FIG. 9 is a simplified diagram of a PLD, such as an FPGA, according to an embodiment of the invention.

FIG. 9 is a simplified diagram of a PLD 960, such as an FPGA, according to an embodiment of the invention. The PLD 960 is fabricated on a silicon wafer that is then separated into chips (also known as dice). The PLD 960 includes a non-volatile memory array 962 having one or more three-terminal non-volatile memory element(s) 964 according to an embodiment of the invention. In a particular embodiment, each of the three-terminal non-volatile memory elements in the non-volatile memory array 962 is a one-time-programmable three-terminal memory element according to an embodiment of the invention. In alternative embodiments, non-volatile memory elements are directly associated with I/Os, without intervening logic, or non-volatile memory elements store information and/or spare logic, or are distributed across a chip, such as being associated with BRAMs.

The PLD 960 also includes configurable logic blocks ("LB") 966a-966h and programmable input/output blocks 968a-968f. The logic blocks and input/output blocks are interconnected by a programmable interconnect structure 970 that includes a large number of interconnect lines that are interconnected by programmable interconnect points commonly known as "PIPs," e.g. 972. PIPs are often coupled into groups, e.g. 974, that implement multiplexer circuits selecting one of several interconnect lines to provide a signal to a destination interconnect line or logic block. Some FPGAs also include additional logic blocks with special purposes (not shown), e.g., DLLs, RAM, and so forth.

The non-volatile memory array 964 is coupled to the other functional blocks of the PLD 960 through the programmable interconnect structure 970. Alternatively, the non-volatile memory array is incorporated in a configurable logic block, a BRAM, an I/O block or other functional block. The configurable logic blocks, programmable input/output blocks, and other functional blocks of the PLC are fabricated using a CMOS process. It is highly desirable that the non-volatile memory array does not require process steps outside of those used in a standard CMOS fabrication facility ("foundry"). This allows incorporation of the non-volatile memory cell into a device without having to alter and qualify a new fabrication process, and allows PLDs according to embodiments of the invention to be fabricated in any one of several CMOS foundries.

While the present invention has been described in connection with specific embodiments, variations of these embodiments will be obvious to those of ordinary skill in the art. For example, different types of gate dielectric and PEC dielectric material may be used in alternative embodiments, and a memory cell might have any one of several different layouts and combinations of devices. Additionally, while the invention has been described with specific reference to PLDs and more particularly to PLDs having CMOS components, embodiments of the invention are desirable in other applications using non-volatile memory. Other modifications may be apparent, or might become apparent, to those of skill in the art. Therefore, the spirit and scope of the appended claims should not be limited to the foregoing description.

The invention claimed is:

1. A non-volatile memory cell comprising:
   a well formed in a substrate;
   a three-terminal non-volatile memory element having
      a source terminal,
      a drain terminal,
      a gate terminal, and
      a first dielectric layer having a first dielectric breakdown strength between the gate terminal and the well; and
   a capacitive storage element having
      a first terminal,
      a second terminal, and
      a second dielectric layer having a second dielectric breakdown strength between the first terminal and the well greater than the first dielectric breakdown strength, the first terminal being connected to the gate terminal and the second terminal being coupled to the well, wherein the capacitive storage element comprises a metal-oxide-semiconductor ("MOS") transistor having a second well, a second source terminal, and a second drain terminal both the second source terminal and the second drain terminal being electrically coupled to the second well.

2. The non-volatile memory cell of claim 1 wherein the three-terminal non-volatile memory element is a metal-oxide-semiconductor ("MOS") transistor and the first terminal is a second gate terminal.

3. The non-volatile memory cell of claim 2 wherein the first dielectric layer is a first oxide layer having a first thickness and the second dielectric layer is a second oxide layer having a second thickness greater than the first thickness.

4. The non-volatile memory cell of claim 3 wherein the first thickness is about 68% of the second thickness.

5. The non-volatile memory cell of claim 2 further comprising a third MOS transistor having a third dielectric layer having a third dielectric breakdown strength greater than the second dielectric breakdown strength.

6. The non-volatile memory cell of claim 5 wherein the first dielectric layer is a first gate oxide layer having a first thickness, the second dielectric layer is a second gate oxide layer having a second thickness greater than the first thickness, and the third dielectric layer is a third gate oxide layer having a third thickness greater than the second thickness.

7. The non-volatile memory cell of claim 3 wherein the first thickness is about 15 Angstroms, the second thickness is about 22 Angstroms, and the third thickness is about 52 Angstroms.

8. The non-volatile memory cell of claim 1 wherein the well is an n-type well.

9. The non-volatile memory cell of claim 1 wherein the well is a p-type well.

10. The non-volatile memory cell of claim 1 wherein the well is an n-type well and the second well is an n-type well.

11. The non-volatile memory cell of claim 1 wherein the three-terminal non-volatile memory element is a one-time programmable memory element.

12. The non-volatile memory cell of claim 1 wherein the capacitive storage element stores charge that is released through the gate terminal during programming to facilitate breakdown of the first dielectric layer.

13. The non-volatile memory cell of claim 1 wherein an impedance between the first terminal and the gate terminal is less than one kilo-Ohm.

* * * * *